TRANSISTOR FREQUENCY MULTIPLIERS

Filed Oct. 15, 1963

2 Sheets-Sheet 1

INVENTOR.
GILBERT L. BOELKE
BY Spencer E. Olson
ATTORNEY.

INVENTOR.
GILBERT L. BOELKE
BY Spencer E. Olson
ATTORNEY.

United States Patent Office 3,230,396

Patented Jan. 18, 1966

3,230,396

TRANSISTOR FREQUENCY MULTIPLIERS

Gilbert L. Boelke, Ebenezer, N.Y., assignor to Sylvania Electric Products Inc., a corporation of Delaware Filed Oct. 15, 1963, Ser. No. 316,329
20 Claims. (Cl. 307—88.5)

This invention relates generally to frequency multiplier circuits employing solid state devices, and more particularly to improved transistor frequency multipliers having increased power gain, output power, and modulating linearity at frequencies beyond the normal limit of the transistor used.

High-frequency power is conventionally generated in a number of ways, including the use of vacuum tube circuits, and transistor low frequency drivers to feed varactor harmonic generators to produce the desired frequency. The latter circuit is usually used in applications where high reliability is required, because of the greater reliability of solid state components, their lack of requirement for warm-up time or heater power, and their smaller size and lighter weight. On the other hand, varactor harmonic generators are not suitable in applications where it is desired to amplitude modulate the high frequency power, since varactor harmonic generators exhibit relatively poor amplitude modulation linearity. Hence, the only presently available solid state power source having relatively good modulating linearity for AM are transistors connected to operate within their inherent frequency limits.

Transistor performance for high-frequencies and high-power levels is limited by practical limitations of fabrication. Thus, although manufacturers are directing extensive effort toward development of higher-power, higher-frequency transistor devices, the designer is limited in the power attainable at high frequencies. For example, when transistors are used as conventional frequency multipliers, power gain and output are reduced below that obtainable by operating them as amplifiers. Furthermore, transistor amplifier gain decreases rapidly as the frequency of operation increases. Using conventional techniques, a transistor operating as an amplifier or multiplier cannot deliver power gain beyond $f_{max}$, the rated frequency limit at which power gain is equal to one.

Accordingly, in order to provide improved performance at high frequencies, it is necessary to exploit certain properties of the transistor that are not used to advantage in conventional circuits. These properties are referred to as "parametric" effects. A parametric effect is observed in any non-linear reactance component, where the value of its capacitance or inductance is a function of applied voltage or current. A familiar example is the voltage variable semiconductor capacitor, commonly referred to as a varactor, which has widespread use in parametric amplifiers, harmonic multipliers, and magnetic and dielectric amplifiers.

A transistor consists of two combined P-N junctions of a semiconducting material, each of the junctions having the properties of a varactor diode; i.e., a voltage sensitive capacitance. This property is utilized, in the large-signal equivalent circuits of the present invention, to extend the high-frequency, high power performance of transistors.

Accordingly, it is a general object of this invention to provide an improved transistor frequency multiplier circuit.

It is a more particular object of the invention to provide a transistor frequency multiplier having improved efficiency, power gain, output power, and modulating linearity at frequencies beyond the normal maximum limit of the transistor used.

Another object is to provide a circuit for increasing the maximum frequency output obtainable from a transistor.

Another object is to provide a circuit for increasing the power gain of frequency multiplication in a transistor.

Another object is to provide a circuit for increasing the available power output from a transistor frequency multiplier.

Another object is to provide a relatively simple solid state high-frequency power source having improved modulating linearity under amplitude modulation conditions of operation.

A further object is to provide a transistor parametric mode frequency multiplier for improving the high frequency and power performance of transistors in large signal applications.

Briefly these objects are attained in an active transistor circuit stage employing a collector-connected output tank circuit by utilizing the parametric properties of the collector-base diode as an harmonic generator. Specifically, the collector-base diode of the transistor is used as the capacitor in a tank circuit in the same manner as a varactor is commonly used, thereby enabling generation of harmonics. The collector tank coil is adjusted to resonance with the effective collector-to-base capacitance at a selected fundamental frequency, and a resonant output circuit is coupled to the parametric mode collector tank for deriving a selected harmonic of the fundamental frequency. For harmonics higher than the second, idler traps may be used to enhance efficiency. The stage can be modulated by modulating the collector bias voltage. The concept may be used to multiply the output frequency of a variety of transistor circuits such as amplifiers, frequency multipliers, oscillators, push-pull configurations, etc.

In one particularly useful implementation of this multiplication technique, the objects of the invention are attained by a circuit design which gives power amplification at a frequency well within the normal frequency limits of the transistor and in which the collector-base diode functions as an harmonic generator. More specifically, the fundamental frequency drive power is injected at the emitter, and the collector tank coil is adjusted to exact fundamental resonance with the effective collector-to-base capacitance. The drive signal is amplified by the transistor in a conventional manner, and the desired harmonic is extracted from the parametric tank circuit.

Other objects, features, and advantages of the invention, and a better understanding of its operation, will become apparent from the following description, reference being had to the accompanying drawings, in which.

Figure 1:
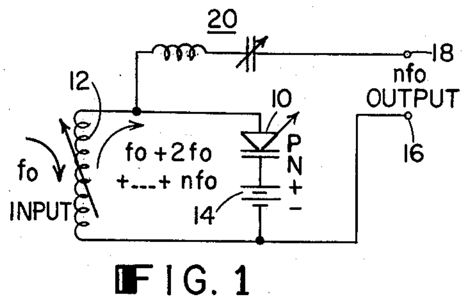
FIG. 1 is a simplified schematic diagram of a varactor tank circuit and associated circuitry for extracting an harmonic, useful in describing the operation of the invention.

Referring to FIG. 1, a simplified varactor tank circuit is shown comprising a varactor 10, consisting of a P-N junction of semiconducting material, a variable or fixed inductance 12, and a bias supply 14. The varactor and bias supply are connected in series across the inductance, with the cathode of the varactor connected to the positive terminal of the bias supply. A first output terminal 16 is connected to the junction of one terminal of the inductance and the negative terminal of bias supply 14, and a second output terminal 18 is connected through an L-C series resonant circuit 20 to the junction of the other terminal of the inductance and the anode of the varactor. The input signal, of fundamental frequency $f_o$, is coupled to the inductance 12, and the varactor tank circuit is tuned to resonance at $f_o$ by suitable adjustment of the variable inductance.

When a varactor diode is reverse-biased and used as a capacitor in a resonant L-C circuit, as shown in FIG. 1, the instantaneous capacitance variations with applied RF potential cause severe distortion of the waveform, resulting in the flow in the tank circuit of harmonic currents $(f_o+2f_o+ \cdot \cdot \cdot +nf_o)$. A desired harmonic can be extracted from the tank circuit by appropriate circuitry; in FIG. 1, an harmonic $nf_o$ is derived at the output terminals 16–18 by tuning series resonant circuit 20 to $nf_o$.

In a transistor equivalent circuit, there are two significant capacitances, one from collector to base, and the other from base to emitter. Since these are depletion layer capacitances of P-N junctions, their capacitance value varies with the width of the depletion layer, which, in turn, is a function of the applied voltage. As previously noted, these voltage variable capacitors constitute the "parametric" elements in the device. In other words, both transistor junctions display the principal property of a varactor diode.

By using the collector-base diode of a transistor as the capacitor in a tank circuit, harmonics are generated in and may be extracted from the collector tank circuit. Thus, an analogy exists between the parametric tank circuit using a transistor and the varactor tank circuit shown in FIG. 1. This analogy will be more clearly understood by referring to FIG. 2, which is a simplified schematic of a transistor parametric mode frequency multiplier. In this case, an input signal of fundamental frequency $f_o$ is applied to the emitter electrode of a transistor 22, the base electrode of which is connected to ground. The collector electrode is connected through a variable or fixed inductance 12 to the positive terminal of a bias supply, represented as a battery 14, the negative terminal of which is connected to ground. The collector tank, the output circuit for the transistor, is tuned to resonance at $f_o$ by suitable adjustment of inductance 12, thereby providing a grounded-base amplifier configuration. The collector electrode of the transistor is also connected through an L-C series resonant circuit 20 to an output terminal 18. As in FIG. 1, the series resonant circuit 20 is tuned to derive a desired harmonic, $nf_o$, at the output terminals.

Figure 2:
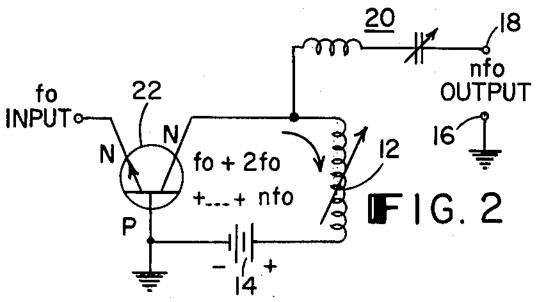
FIG. 2 is a simplified schematic diagram of a transistor frequency multiplier circuit embodying the invention and having an output circuit designed to function as a harmonic generator.

It will be noted that the circuit of FIG. 2 is very similar to the varactor circuit, except that a third electrode is available in the transistor circuit. This additional electrode, namely, the emitter, is used to inject drive power at the fundamental frequency, $f_o$. This drive signal is amplified by the transistor in the conventional manner, since the output, or collector tank is tuned to the fundamental frequency, and the polarity of the bias supply is appropriate for operation as an amplifier.

By virtue of this circuit configuration, the transistor operates as a conventional amplifier at the input frequency $f_o$, providing an amplifier power gain greater than that attainable by operation as a conventional frequency multiplier or as an amplifier at the output frequency. Further, the reduction of gain in the parametric multiplier formed by the collector-base junction is less than the difference in gain between an amplifier and a conventional multiplier. As a result, the net power gain of this amplifier-harmonic generator circuit combination is higher than that of a conventional transistor frequency multiplier.

It will be realized, however, that since a transistor is employed as the active element in FIG. 2, the parametric mode multiplication concept need not be limited to applications wherein the transistor is connected in a more or less optimum amplifier configuration. For example, if the frequency of the input signal applied to the emitter were a subharmonic of $f_o$, rather than being equal to the fundamental frequency to which the collector tank is tuned, and the series resonant circuit 20 were removed, FIG. 2 would resemble a conventional frequency multiplier. However, if the collector tank is designed to optimize parametric effects and means, such as resonant circuit 20, is provided for deriving a selected harmonic of the fundamental frequency of the tank circuit, a single transistor is capable of delivering a higher frequency and larger power output than a single transistor connected as a conventional multiplier.

This fact will be more clearly understood from a consideration of the problems inherent in the use of transistors for frequency multiplication to relatively high frequencies. For example, in the case of multiplying an input frequency by four to a frequency level at the upper limit of the transistor used, there is little, if any, gain and an additional amplifier stage would be required to obtain useable output power. Another approach would be to cascade two conventional doubler stages, which may provide the desired gain since the expenditure of gain is lower for lower orders of multiplication in a conventional multiplier. In accordance with the herein described concept, however, the gain of a conventional transistor doubler operating well within its frequency range is substantially preserved and the times four output provided simply by deriving the second harmonic of the doubler tank operating in the parametric mode. Thus, the times four output with gain is provided by a single transistor multiplier stage rather than two or more stages. Furthermore, an harmonic may be derived which is well beyond the normal frequency limit of the transistor employed. In addition to their efficacy in amplifier and multiplier stages, the parametric properties of any transistor stage having a collector connected output tank circuit may be exploited to provide frequency multiplication with gain; examples are oscillators and push-pull configurations, specific implementations of which will be described hereinafter.

Figures 3, 4:
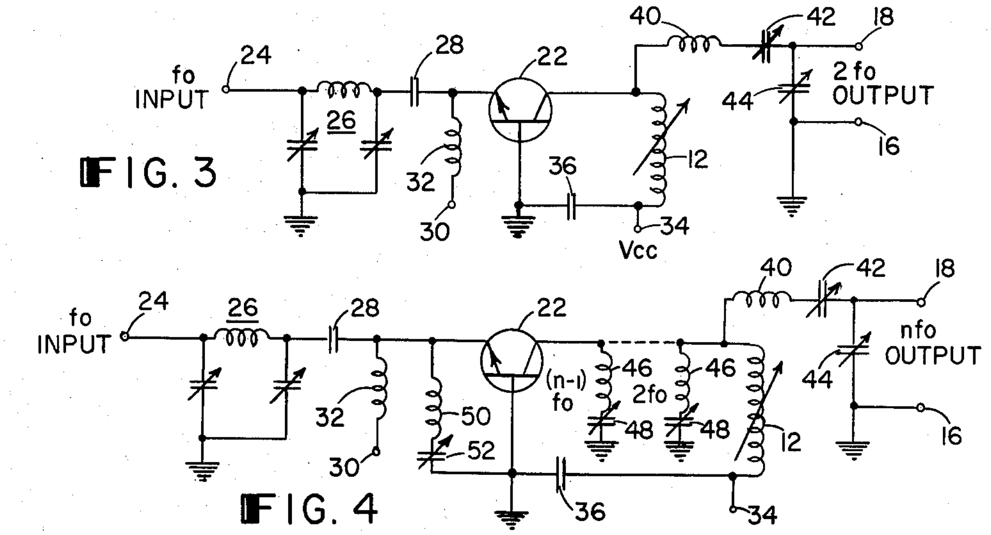
FIG. 3 is a schematic diagram of a transistor parametric mode frequency doubler circuit in accordance with the invention.
FIG. 4 is a schematic diagram of another transistor parametric mode frequency multiplier circuit.

Referring now to FIG. 3, the complete circuit for a frequency doubler embodying invention is shown as comprising a signal input terminal 24 serially connected through a pi matching network 26, tuned to be resonant at the input frequency $f_o$, and a D.C. blocking capacitor 28 to the emitter electrode of transistor 22. The emitter is also connected through a choke coil 32 to a source of emitter bias potential, represented by terminal 30. The base electrode of the transistor is connected to ground. The collector electrode of the transistor is serially connected through variable inductance 12 to a source of collector supply voltage, represented by terminal 34, and through an A.C. bypass capacitor 36 to ground. The voltage source 34 functions not only as the collector supply but also as the "varactor" bias for the collector-to-base capacitance of the transistor to bias the transistor to the optimum range of collector current. The collector is also connected through the series combination of inductance 40 and variable capacitor 42 to an output terminal 19. Output terminal 16 is connected to ground, and a variable capacitor 44 is connected across output terminals 16 and 18.

In this configuration, the transistor stage operates as a grounded-base amplifier so as to effectively connect the collector-base capacitance directly across the tank coil 12. The transistor output or collector tank circuit is brought into exact fundamental resonance with the effective transistor collector-to-base capacitance by suitable adjustment of variable inductance 12. A variable inductance is preferred over a variable capacitor for collector tank tuning since the latter would "swamp out" the collector-base capacitance variation, thereby reducing the effective amplitude of the generated harmonics. Inductance 40 and variable capacitors 42 and 44 comprise an harmonic pickoff and output impedance matching network, this network being tuned to be resonant at the second harmonic $2f_o$, to achieve doubling.

For harmonics higher than the second, idler traps are necessary, as in varactor multipliers, for maximum efficiency. An optimum circuit design would, in general, include tuned traps at all harmonics of $f_o$ between $f_o$ and $nf_o$, where $nf_o$ is the desired harmonic output frequency, at which the order of the harmonic is a prime number. In other words, if $m$ represents the order of harmonic of $f_o$ ($m=2$ at $2f_o$, 3 at $3f_o$, etc), then for $n>m>1$, where $n$ is the order of multiplication at the output, there will be a trap at all frequencies where $m$ is a prime number. FIG. 4 shows a frequency multiplier, embodying the present invention, for multiplication to $nf_o$ and employing traps in the collector tank circuit; components corresponding to similar functioning components in FIG. 3 are correspondingly numbered. Each of the traps comprise an inductance 46 and a variable capacitor 48 serially connected, in that order, from the collector electrode of transistor 22 to ground. The variable inductance 12 is, as before, tuned to bring the collector tank circuit into exact fundamental resonance, and the harmonic pickoff and matching network comprising components 40, 42, and 44 is tuned to derive the $n$th harmonic. In addition, a trap resonant at the $n$th harmonic and comprising inductance 50 and variable capacitor 52 is serially connected, in that order, across the emitter-base circuit of transistor 22; the exact role of this trap is not yet fully understood, but it has been observed to improve the efficiency and power gain of the stage.

As in the circuit of FIG. 2, transistor 22 may be operated in the FIG. 4 configuration in a manner similar to a conventional frequency multiplier with a subharmonic of the collector tank fundamental frequency $f_o$ applied as the input signal to terminal 24 rather than $f_o$. Such a circuit would distinguish from a conventional multiplier, however, in the inclusion of the traps in the output tank circuit and the derivation of an harmonic of $f_o$ from the collector tank.

A quadrupler circuit employing a 2N834 type transistor in the circuit of FIG. 4, and with a fundamental input frequency of 133 megacycles per second (mc./s.) with 4 milliwatts (mw.) of drive power, has been observed to deliver about 35 mw. of output power at 532 mc./s. This represents a considerable improvement over the performance of conventional transistor frequency multipliers when one considers that a type 2N834 transistor employed as a conventional class C frequency tripler is limited to 15 mw. of output power at 140 mc./s. In another case, a type 2N2631 transistor, normally usable only to about 200 mc./s., was used as a parametric mode tripler from 141 mc./s. to 423 mc./s., in accordance with the present invention, and observed to provide an output of 1.6 watts for a 1 watt input drive level; overall efficiency was about 21%.

The bias voltage for the varactor-like collector-to-base capacitance, and the output power to the collector tank circuit at $f_o$, vary simultaneously with the varying collector supply voltage, V*cc*, thereby enabling the stage to be amplitude modulated to a 100% modulation level without any abrupt discontinuities. The present transistor multiplier configuration therefore provides improved amplitude modulating linearity over the conventional transistor driver-varactor harmonic generator combination. This feature is illustrated in FIG. 5 which shows the modulating linearity curves (plot of square root of relative power output vs. V*cc*) for the aforementioned 423 mc./s. output parametric tripler using a type 2N2631 transistor; the collector and base of the stage were amplitude modulated to provide the modulated output in a UHF transmitter application.

Figures 5, 6:
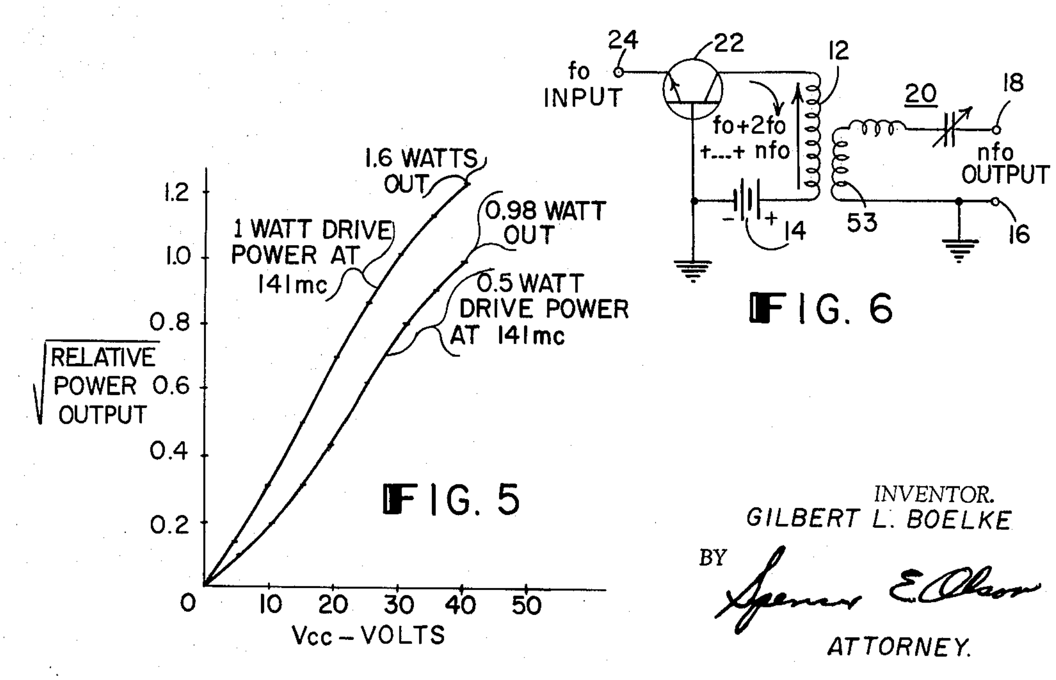
FIG. 5 are curves illustrating the modulation linearity of a parametric mode tripler circuit employing a typical transistor.
FIG. 6 is a simplified schematic diagram of a transistor parametric mode frequency multiplier circuit employing an alternate output coupling circuit arrangement.

An alternate circuit arrangement which gives a significant improvement in the transistor parametric mode multiplier is shown in the simplified schematic diagram of FIG. 6, which is the same as the circuit of FIG. 2, and having correspondingly numbered components, except for the output circuit. In FIG. 6, the series resonant circuit 20 is inductively coupled to the collector tank inductance 12 via coil 53, instead of being directly connected to the transistor collector electrode. The use of inductive coupling substantially reduces unwanted frequencies at the output terminals 16–18. For example, compared to a circuit connected as shown in FIG. 3, a doubler circuit employing inductive coupling in the output exhibited an increase of 10 db in the rejection of the fundamental frequency in the output.

Figure 7:
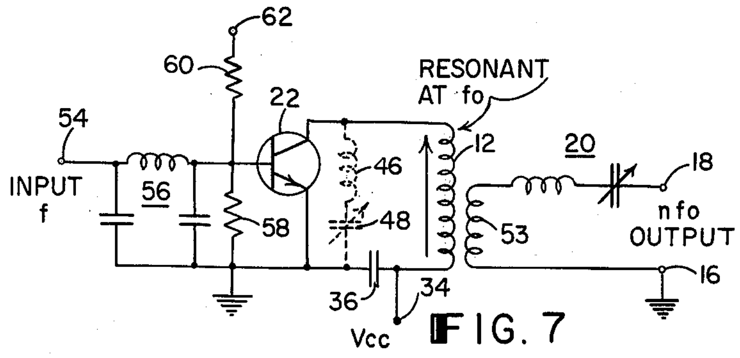
FIG. 7 is a schematic diagram of a frequency multiplier according to the invention employing a grounded-emitter transistor configuration.

Referring to FIG. 7, another alternate circuit arrangement is shown in which transistor 22 is connected in a grounded-emitter configuration. The input signal applied at terminal 54 is coupled through a pi matching network 56 to the base of transistor 22. Bias for the base of the transistor is provided by a voltage divider network comprising a resistor 58 connected between the base electrode and ground and a resistor 60 connected between the base electrode and a source of bias voltage represented by terminal 62. The emitter electrode is connected to ground, and the collector electrode is connected through variable inductance 12 to a source of collector supply voltage V*cc*, represented by terminal 34, and through A.C. bypass capacitor 36 to ground. Series resonant L-C traps may be connected between the collector and ground as previously described. The signals appearing in the collector tank circuit are inductively coupled via coil 53 to the output network comprising series resonant circuit 20 and output terminals 16 and 18. As previously discussed, the frequency of the input signal applied to terminal 54 may be the same as the fundamental frequency $f_o$ at which the collector tank circuit is resonant, in which case the transistor operates as a nearly optimum common emitter amplifier, or the input signal may be a subharmonic of $f_o$, in which case the transistor operates similar to a conventional frequency multiplier with the exception that the properties of the parametric tank are exploited.

The primary functional differences between the grounded-emitter and grounded-base embodiments are the presence of a feedback component of the output circuit to input circuit in the grounded-emitter circuit, the feedback being transmitted through the collector-to-base junction, and a modification of the collector output capacitance due to this feedback. Specifically, whereas the collector output capacitance of the grounded-base circuit may be represented by $C_{ob}$, the grounded-emitter collector output capacitance is represented by $h_{fe}$ $C_{ob}$, where $h_{fe}$ is the current gain or A.C. beta of the transistor. Satisfactory performance of the multiplier shown in FIG. 7 can be obtained by taking these factors into account in choosing design parameters.

Figure 8:
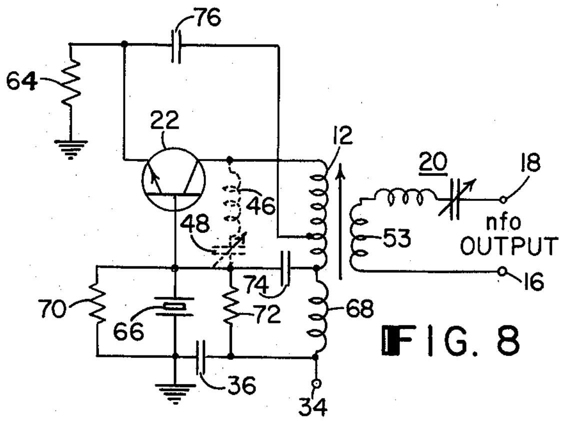
FIG. 8 is a schematic diagram of an harmonic oscillator embodying the invention.

As previously mentioned, the above-disclosed technique may also be applied to the collector circuit of any tuned transistor oscillator to derive an output signal at an harmonic of the oscillator circuit. In FIG. 8, for example, an harmonic oscillator in accordance with the invention is shown comprising a transistor 22 having its emitter electrode connected through a resistor 64 to ground, its base electrode connected through a piezoelectric resonator 66 to ground, and its collector electrode connected through a variable inductance 12 and an A.C. isolating choke 68 to a source of bias voltage, represented by terminal 34. An A.C. bypass capacitor 36 is connected between terminal 34 and ground. Base bias for the transistor is provided by a voltage divider network comprising a resistor 70 connected between the base electrode and ground and a resistor 72 connected between the base electrode and bias voltage terminal 34. The oscillator A.C. loop is completed by a D.C. blocking capacitor 74 connected between the base electrode and the terminal of inductance 12 opposite to that which the collector is connected, and a D.C. blocking capacitor 76 connected between the emitter electrode and a tap on inductance 12. The fundamental frequency, $f_o$, of the oscillator is determined by adjustment of inductance 12; $f_o$ may be the frequency of the crystal 66 or a crystal overtone. The effective circuit loop including inductance 12 and the collector-to-base capacitance of transistor 12, when tuned to resonance, comprises a parametric tank circuit. A selected harmonic of $f_o$ is derived by the previously described output circuit comprising coil 53, series resonant circuit 20, and terminals 16 and 18. In addition, series resonant traps may be connected between the collector and base of transistor 22 as previously described.

Figure 9:
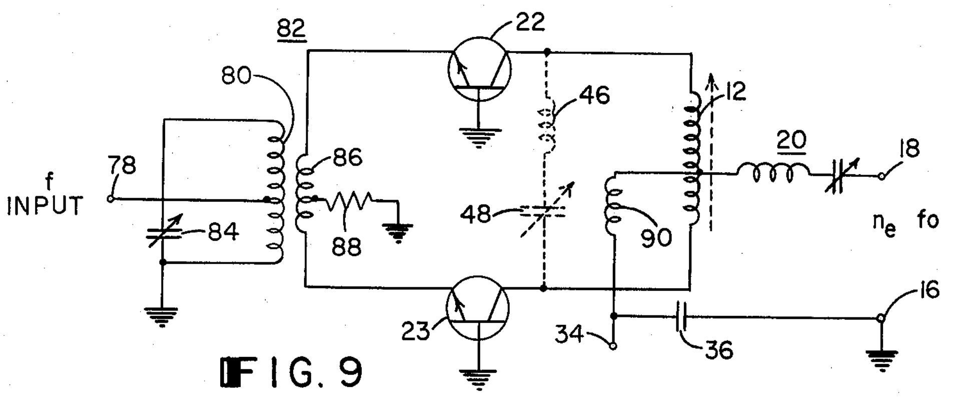
FIG. 9 is a schematic diagram of a push-pull multiplier embodying the invention.

An example of a multiple transistor configuration embodying the invention is the push-pull multiplier circuit shown in FIG. 9. In this instance the input signal is transformer-coupled to the emitter electrodes of transistors 22 and 23. The signal input terminal 78 is connected to the center tap of the primary winding 80 of input coupling transformer 82; one terminal of the primary winding 80 is connected directly to ground, and the other terminal is connected through a variable capacitor 84 to ground. Capacitor 84 is adjusted to tune the primary circuit to resonance at the frequency of the input signal. The emitter electrodes of transistors 22 and 23 are respectively connected to opposite terminals of the secondary winding 86 of transformer 82, and the center tap of winding 86 is connected through resistor 88 to ground. The base electrodes of both transistors are connected to ground, and the collector electrodes of the pair of transistors are respectively connected to opposite ends of a variable inductance coil 12. The center tap of coil 12 is connected through an RF choke 90 to a source of collector supply voltage *Vcc*, represented by terminal 34, and through A.C. bypass capacitor 36 to ground.

Variable inductance 12 is adjusted to resonance with the collector-to-base capacitances of transistors 22 and 23 at a selected fundamental frequency $f_o$. A desired harmonic of the resulting parametric tank circuit is derived by using a suitable output network. The output network preferred for deriving even harmonics of $f_o$ is that shown in FIG. 9, and comprises a series resonant circuit 20 connected between the center tap on coil 12 and output terminal 18, circuit 20 being tuned to $n_e f_o$ where $n_e$ represents even harmonic numbers such as 2, 4, 6 . . . etc. The output network preferred for obtaining odd harmonics of $f_o$ would be an inductively coupled output network similar to that shown in FIG. 8, except that circuit 20 would be tuned to $n_o f_o$ where $n_o$ represents odd harmonic numbers such as 1, 3, 5 . . . etc. Series resonant traps may be connected across the collector electrodes of transistors 22 and 23 as indicated to handle the intermediate harmonics of $f_o$ between the fundamental frequency and the selected harmonic output.

From the foregoing it is seen that the applicant has provided a unique frequency multiplication technique which may be used to exploit the parametric properties of the collector-base diode of any active transistor stage. The invention provides a single stage transistor multiplier circuit capable of operating at higher frequencies, and having higher output power, efficiency, and power gain than conventional transistor multipliers. In addition, it provides advantages over conventional transistor driver varactor harmonic generator systems of amplitude modulating capability, circuit simplification (less parts), and improved stability with varying supply voltages. At lower frequencies, that is, within the conventional range of operation of the transistors used, the improved transistor frequency multiplier has proven to be far more efficient than a conventional transistor frequency multiplier. Power gain and output is several times that of a conventional stage. For example, one amplifier-tripler stage of the improved design (i.e., a transistor stage wherein the frequency of the input signal is equal to the fundamental frequency to which the collector parametric tank is tuned) could replace two normally operated stages. It would require less drive, less D.C. power, and deliver more output; reliability would be improved because of the reduction in parts count.

In essence, the above-mentioned advantages are achieved by designing the collector tank circuit of a transistor stage so as to take full advantage of its operation as a parametric mode harmonic generating loop, with the collector-to-base capacitance functioning in the same manner as a varactor diode, and providing suitable means for deriving a selected harmonic of the fundamental frequency of said parametric collector tank. Where the fundamental frequency of the collector tank is tuned to be within the frequency limits of the transistor used and to be the same as the input signal frequency, a unique amplifier-multiplier combination results in a single transistor stage.

Other circuit arrangements are possible, such as using different input matching and output network configurations for supporting the fundamental and harmonic frequencies and matching the desired harmonic to the load. Also for high-order multiplication, the intermediate harmonic frequency idler traps may be omitted in favor of circuit simplification, where lower efficiency and output is acceptable. In addition, as mentioned, the invention may be applied to any single—or multiple—transistor circuit stage having a collector connected tank circuit. It is applicant's intention, therefore, that the invention not be limited to what has been specifically shown and described except insofar as such limitations appear in the appended claims.

What is claimed is:

1. A frequency multiplier comprising, in combination, a transistor circuit stage including a transistor having emitter, collector and base electrodes and exhibiting internal collector-to-base capacitance means for applying a signal of predetermined frequency across said emitter and base electrodes, an inductance connected across said collector and base electrodes to provide an output tank circuit for said stage comprising the effective circuit loop including said inductance and said collector-to-base capacitance, said output tank circuit being resonant at a selected fundamental frequency and being operative as a parametric tank circuit to generate harmonics of said fundamental frequency, and means coupled to said output tank circuit for deriving a selected harmonic of said fundamental frequency.

2. A frequency multiplier in accordance with claim 1 wherein said transistor circuit stage is an oscillator.

3. A frequency multiplier comprising, in combination, a transistor circuit stage including a transistor having emitter, collector and base electrodes and having an output tank circuit, means for applying a signal of predetermined frequency across said emitter and base electrodes, a source of bias potential, said output tank circuit including an inductor connected between the collector electrode of said transistor and said source of bias potential, a source of reference potential, means coupling the junction of said source of bias potential and said inductor to said source of reference potential, means connecting said base electrode to said source of reference potential, said transistor having internal collector-to-base capacitance, said inductor having an inductance to resonate with said collector-to-base capacitance at a selected fundamental frequency and operative as a parametric tank circuit to generate harmonics of said fundamental frequency, an output terminal, and circuit means resonant at a selected harmonic of said fundamental frequency coupled between said tank circuit and said output terminal.

4. A frequency multiplier in accordance with claim 3 wherein said last-mentioned circuit means is connected between the collector electrode of said transistor and said output terminal, and said source of bias potential is adapted to be modulated and provides both energizing voltage for the collector of said transistor and bias for said collector-to-base capacitance.

5. A frequency multiplier in accordance with claim 3 wherein said last-mentioned circuit means is inductively coupled to said inductor, and said source of bias potential provides both energizing voltage for the collector of said transistor and bias for said collector-to-base capacitance.

6. A frequency multiplier in accordance with claim 3 wherein said last-mentioned circuit means is resonant at an harmonic higher than the second harmonic of said fundamental frequency, and further including at least one series resonant trap effectively connected from the collector electrode of said transistor to said source of reference potential, each of said traps being resonant at an harmonic of said fundamental frequency between and exclusive of said fundamental frequency and said selected harmonic.

7. A frequency multiplier comprising, in combination, a transistor circuit stage including a transistor having emitter, collector and base electrodes and having an output tank circuit, means for coupling an input signal of predetermined frequency across said emitter and base electrodes, said transistor having an internal collector-to-base capacitance, said output tank circuit comprising an effective circuit loop including an inductor coupled across said collector and base electrodes and said collector-to-base capacitance resonant at a selected harmonic of the frequency of said input signal and operative as a parametric tank circuit to generate harmonics of said selected harmonic frequency, and means coupled to said output tank circuit for deriving a selected one of the generated harmonics of said selected harmonic frequency.

8. A frequency multiplier comprising, in combination, a transistor circuit stage including a transistor having first, second, and collector electrodes, means for coupling an input signal of predetermined frequency to said first electrode, a source of reference potential, means connecting said second electrode to said source of reference potential, a source of bias potential, an inductor coupled between said collector electrode and said source of bias potential, means coupling the junction of said source of bias potential and said inductor to said source of reference potential, said transistor having an internal capacitance between the collector and another of said electrodes, said inductor having a value of inductance to resonate with said capacitance at a fundamental frequency which is a selected harmonic of said predetermined frequency, whereby said inductor and capacitance are operative as a parametric tank circuit to generate harmonics of said fundamental frequency, an output terminal, and circuit means resonant at a selected harmonic of said fundamental frequency coupled between said parametric tank circuit and said output terminal.

9. A frequency multiplier in accordance with claim 8 wherein said first and second electrodes are respectively emitter and base electrodes of said transistor, and said source of bias potential provides both the energizing voltage for the collector of the transistor in said circuit stage and bias for said capacitance.

10. A frequency multiplier in accordance with claim 8 wherein said first and second electrodes are respectively base and emitter electrodes of said transistor, and said source of bias potential provides both the energizing voltage for the collector of the transistor in said circuit stage and bias for said capacitance.

11. A frequency multiplier comprising, in combination, a transistor amplifier circuit having an input terminal and an output tank circuit, means for coupling an input signal to be amplified to said input terminal, said transistor having emitter, collector and base electrodes and an internal collector-to-base capacitance, said output tank circuit comprising a series loop including an inductor and said collector-to-base capacitance resonant at the frequency of said input signal and being operative as a parametric tank circuit to generate harmonics of the frequency of said input signal, and means coupled to said output tank circuit for deriving a selected harmonic of said input signal frequency.

12. A frequency multiplier comprising, in combination, an amplifier circuit including a transistor having first, second, and collector electrodes, means for coupling an input signal to be amplified to said first electrode, a source of reference potential, means connecting said second electrode to said source of reference potential, a source of bias potential, an inductor connected between said collector electrode and said source of bias potential, means coupling the junction of said source of bias potential and said inductor to said source of reference potential, said transistor having an internal capacitance between the collector and another of said electrodes, said inductor having a value of inductance to resonate with said capacitance at the frequency of said input signal and operative as a parametric tank circuit to generate harmonics of the frequency of said input signal, an output terminal, and circuit means resonant at a selected harmonic of said input signal frequency coupled between said parametric tank circuit and said output terminal.

13. A frequency multiplier in accordance with claim 12 wherein said first and second electrodes are respectively emitter and base electrodes of said transistor, and said source of bias potential provides both the collector supply voltage for said amplifier and the bias for said capacitance.

14. A frequency multiplier in accordance with claim 12 wherein said first and second electrodes are respectively base and emitter electrodes of said transistor, and said source of bias potential provides both the collector supply voltage for said amplifier and bias for said capacitance.

15. A frequency multiplier in accordance with claim 12 wherein said circuit means is resonant at an harmonic of said input signal frequency higher than the second, and further including at least one series resonant trap connected from the collector electrode of said transistor to said source of reference potential, each of said traps being resonant at an harmonic of said input signal frequency between and exclusive of said input signal frequency and said selected harmonic.

16. A frequency doubler comprising, in combination, a grounded-base amplifier circuit including a transistor having emitter, base, and collector electrodes, means for coupling an input signal to be amplified to said emitter electrode, a source of reference potential, means connecting said base electrode to said source of reference potential, a source of direct current potential, a variable inductor connected between said collector electrode and said source of direct current potential and capacitively coupled to said source of reference potential, said transistor having a collector-base junction exhibiting the properties of a voltage variable reactance diode, said inductor being tunable to resonance with the effective collector-to-base capacitance of said collector-base junction at the frequency of said input signal thereby forming a parametric mode harmonic generating loop, and means coupled to said harmonic generating loop for extracting the second harmonic of said input signal frequency.

17. A frequency multiplier comprising, in combination, a grounded-base amplifier circuit including a transistor having emitter, base, and collector electrodes, means for coupling an input signal to be amplified to said emitter electrode, a source of reference potential, means connecting said base electrode to said source of reference potential, a source of direct current potential, a variable inductor connected between said collector electrode and said source of direct current potential and capacitively coupled to said source of reference potential, said transistor having a collector-base junction exhibiting the properties of a voltage variable reactance diode, said inductor being tunable to resonance with the effective collector-to-base capacitance of said collector-base junction at the frequency of said input signal thereby forming a parametric mode harmonic generating loop, means coupled to said harmonic generating loop for deriving therefrom a selected harmonic of said input signal frequency higher than the second, and at least one series-resonant trap connected from the collector electrode of said transistor to said source of reference potential, each of said traps being resonant at an harmonic of said input signal frequency between and exclusive of said input signal frequency and said selected harmonic.

18. A frequency multiplier comprising, in combination, first and second transistors each having emitter, collector, and base electrodes and an internal collector-to-base capacitance, a source of reference potential, means connecting the base electrode of both said transistors to said source of reference potential, means for coupling an input signal of predetermined frequency in push-pull to the emitter electrodes of said first and second transistors, a first inductor connected between the collector electrodes of said first and second transistors, said inductor having a center-tap and a value of inductance to resonate with the collector-to-base capacitances of said transistors at a fundamental frequency which is a selected harmonic of said predetermined frequency, a source of bias potential, a second inductor connected between the center tap of said first inductor and said source of bias potential, said first inductor and the collector-to-base capacitance of said transistors being operative as a parametric tank circuit to generate harmonics of said fundamental frequency, an output terminal, and circuit means series-resonant at a selected harmonic of said fundamental frequency connected between the center tap of said first inductor and said output terminal.

19. A frequency multiplier in accordance with claim 18 wherein said last-mentioned circuit is resonant at an harmonic of said fundamental frequency higher than the second, and further including at least one series-resonant trap connected between the collector electrodes of said first and second transistors, each of said traps being resonant at an harmonic of said fundamental frequency between and exclusive of said fundamental frequency and said selected harmonic.

20. A frequency multiplier comprising, in combination, a transistor circuit stage including a transistor having first, second, and collector electrodes, means for applying a signal of predetermined frequency to said first electrode, said transistor having an internal capacitance between said collector and said second electrodes, an inductance coupled across said collector and said second electrodes, the effective circuit loop including said inductance and said internal capacitance being resonant at a selected fundamental frequency and operative as a parametric tank circuit to generate harmonics of said fundamental frequency and providing an output tank circuit for said stage, and means coupled to said output tank circuit for deriving a selected harmonic of said fundamental frequency.

References Cited by the Examiner

UNITED STATES PATENTS

| | | | |
|---|---|---|---|
| 2,149,450 | 3/1939 | Lindenblad | 328—17 |
| 3,046,410 | 7/1962 | Robinson | 321—69 |
| 3,177,378 | 4/1965 | Pulfer | 307—88.5 |

OTHER REFERENCES

Electronics: Transistor Operation Beyond Cutoff Frequency, by Vodicka et al., August 26, 1960.

Wireless World: Parametric Amplification With Transistors, by Rhode, October, 1961.

ARTHUR GAUSS, *Primary Examiner.*

J. S. HEYMAN, S. D. MILLER, *Assistant Examiners.*